United States Patent [19]

Watanabe

[11] Patent Number: 4,618,851
[45] Date of Patent: Oct. 21, 1986

[54] APPARATUS FOR REPRODUCING SIGNALS PRE-STORED IN A MEMORY

[75] Inventor: Tokumi Watanabe, Tachikawa, Japan

[73] Assignee: Victor Company of Japan, Ltd., Yokohama, Japan

[21] Appl. No.: 643,065

[22] Filed: Aug. 22, 1984

[30] Foreign Application Priority Data

Aug. 23, 1983 [JP] Japan .................. 58-153669

[51] Int. Cl.[4] .................. G10H 1/02; G10H 3/03; H03M 1/70
[52] U.S. Cl. .................. 340/347 DA; 340/347 AD; 84/1.27; 84/1.28
[58] Field of Search .................. 84/1.27, 1.28; 340/347 AD, 347 DA

[56] References Cited

U.S. PATENT DOCUMENTS

| 3,500,247 | 3/1970 | Sekimoto et al. | 340/347 DA |
| 3,685,047 | 8/1972 | Sherer et al. | 340/347 AD |
| 3,906,487 | 9/1975 | Siems | 340/347 DA |
| 4,416,178 | 11/1983 | Ishida | 84/1.27 |
| 4,454,608 | 6/1984 | Maeba | 340/347 DA |
| 4,554,854 | 11/1985 | Kato | 84/1.27 |

FOREIGN PATENT DOCUMENTS 2329169  11/1985  Fed. Rep. of Germany .

Primary Examiner—L. T. Hix
Assistant Examiner—David M. Gray
Attorney, Agent, or Firm—Roberts, Spiecens & Cohen

[57] ABSTRACT

An apparatus for reproducing signals which are pre-stored in a memory, comprises a memory pre-stored with signals made up of a level and gain change codes, a detecting circuit for detecting the gain change code from a signal read out from the memory, and a converting circuit supplied with the signal read out from the memory, for producing a reproduced signal having a waveform which is essentially the same as the original analog signal waveform. The level code is an original analog signal which is amplified, sampled, and digitally coded. The original analog signal has a level smaller than threshold values in a small level region. The gain change code has predetermined values and replaces the level code at least for a certain period from a predetermined time in the small level region. The converting circuit is variably controlled of a gain thereof after receiving an output detection signal of the detecting circuit so as to attenuate the level of the signal read out from the memory to an extent complementary to the amplification performed at the time when the signal is pre-stored in the memory, and subjects the signal read out from the memory to a digital-to-analog conversion regardless of whether the detection signal is received.

9 Claims, 34 Drawing Figures

APPARATUS FOR REPRODUCING SIGNALS PRE-STORED IN A MEMORY

BACKGROUND OF THE INVENTION

The present invention generally relates to apparatuses for reproducing signals which are pre-stored in a memory, and more particularly to an apparatus which reproduces a small level portion and a large level portion of an analog signal which is obtained by performing a digital-to-analog conversion, with a high resolution, when reproducing and subjecting to the digital-to-analog conversion a pulse code modulation (PCM) signal which is pre-stored in a memory.

In a conventional electronic organ of a first type, an output signal of an oscillator circuit is generally subjected to a waveform shaping, so as to obtain a signal waveform closely resembling the sound of a desired instrument. However, the sound of the instrument obtained by this electronic organ of the first type, is simply an artificially obtained sound which closely resembles the sound of the actual instrument. Accordingly, an electronic organ of a second type which is capable of obtaining a sound equivalent to the sound of the actual instrument, has been developed. In this electronic organ of the second type, the sound of the actual instrument is converted into a PCM signal and is stored in a digital memory. The sound is produced from the electronic organ by reading out the pre-stored PCM signal from the digital memory and then converting the read out signal into an analog signal. The electronic organ of the second type thus comprises a built-in memory which is prepared by the manufacturer, and the built-in memory pre-stores the PCM signal which is obtained by converting the sound of the actual instrument into the PCM signal. Hence, when the operator plays the electronic organ of the second type, the desired sound is read out from the built-in memory so as to produce a sound which is essentially the same as the sound of the actual instrument.

According to a conventional apparatus for storing the sound of the actual instrument in the memory, an audio signal corresponding to the sound of the actual instrument is sampled and is then subjected to a linear quantization so as to obtain a digital (PCM) signal. This digital signal is written into the memory. However, since the digital signal stored in the memory has a constant quantization width, the quantization noise becomes larger as the level of the input signal becomes smaller, and there is a problem in that the signal-to-noise (S/N) ratio becomes deteriorated.

Accordingly, there was an apparatus which samples the audio signal and then compares the sampled audio signal with a predetermined reference value. The level of the audio signal having a level smaller than the reference value is amplified, and the level of the audio signal having a level larger than the reference value is unchanged. The audio signal which is controlled of its level in this manner, is subjected to a quantization and is written into the memory. According to this conventional apparatus, the signal storage can be performed with a high resolution with respect to the input signal having a small level. Among a predetermined number of bits in the digital data which is stored and read out from the memory, at least one bit is used as a so-called gain bit for discriminating in a reproducing system whether the level is amplified. The remaining bits among the predetermined number of bits are used as a level code indicating the level information. For this reason, the number of bits of the level code, that is, the quantization number of bits in this conventional apparatus is smaller than the quantization number of bits in the conventional apparatus which performs the linear quantization, by the number of bits which are used for the gain bit. As a result, the resolution of the input signal having a large level becomes deteriorated. In addition, in a vicinity of a zero level (center level) of the signal waveform, the level is discriminated as being a small level and this zero level is amplified. Therefore, the level of the signal is controlled at various points on the signal waveform, and the original signal waveform cannot be reproduced accurately unless an attenuator having an accurate gain is used. Hence, there is a problem in that a crossover distortion occurs at the point where the level changes, and the points where the S/N ratio is poor becomes large.

SUMMARY OF THE INVENTION

Accordingly, it is a general object of the present invention to provide a novel and useful apparatus for reproducing signals which are pre-stored in a memory, in which the problems described heretofore have been eliminated.

Another and more specific object of the present invention is to provide an apparatus for reproducing signals which are pre-stored in a memory, which comprises a gain change code detecting circuit for reading out a level code indicative of a level information or a gain change code from the memory which stores the level code or the gain change code which replaces the level code, and for detecting the gain change code, and means for attenuating the level of the reproduced signal to a predetermined level responsive to an output detection signal of the gain change code detecting circuit. According to the apparatus of the present invention, distortion and quantization noise will not occur with respect to an input signal having a small level, and the pre-stored signals can be reproduced with a satisfactory S/N ratio. Further, compared to the conventional apparatus which simultaneously transmits the gain bit together with the level code, it is possible to improve the resolution and S/N ratio of a large-level input signal which assumes a value indicated by the full scale or a value in a vicinity thereof, because the number of bits of the level code can be increased by the number of bits of the gain change code. In addition, according to the apparatus of the present invention, the gain change code is not generated every time the input signal assumes a level in the vicinity of the zero level, and the deterioration in the S/N ratio due to the crossover distortion is greatly reduced compared to the conventional apparatus.

Still another object of the present invention is to provide an apparatus for reproducing signals which are pre-stored in a memory, which comprises replacing data producing means for producing a predetermined level code which is to replace the gain change code, responsive to the output detection signal of the gain change code detecting circuit. According to the apparatus of the present invention, it is possible to obtain a reproduced signal having a satisfactory fidelity. When the replacing data producing means is constituted by means for replacing the gain change code by a level code indicative of a zero level at a predetermined time in the input signal waveform, a switch can be used to read out or not read out a signal from the memory, and the circuit construction can be simplified. In the vicinity of the zero level of the input signal, the crossover distortion due to the switching of the gain does not become a problem. Thus, the switching of the gain need not be performed with an extremely high precision.

A further object of the present invention is to provide an apparatus for reproducing signals which are pre-stored in a memory, which comprises level varying means for reading out the level code or the gain change code from the memory. A digital signal in which the level code is replaced by a first gain change code at a first time within a period in which the input signal level is smaller than a predetermined absolute value, and in which the level code is replaced by a second gain change code at a last time within a period in which the input signal level is smaller than the predetermined absolute value, is stored in the memory. When the first gain change code is detected, the level varying means attenuates the level of the reproduced signal and returns the level to the original level. On the other hand, when the second gain change code is detected, the attenuating operation with respect to the reproduced signal is stopped and the gain is returned to the original gain. According to the apparatus of the present invention, it is possible to positively reproduce a signal with a satisfactory S/N ratio, even when the signal has a signal waveform other than a monotone increasing or decreasing signal waveform.

Another object of the present invention is to provide an apparatus for reproducing signals which are pre-stored in a memory, which reads out digital signal from the memory and performs a level attenuating operation from a time when a gain change code is detected. A digital signal in which the gain change code is transmitted instead of the level code at a first time within a period in which the level of the input signal having a monotone decreasing (or increasing) signal waveform becomes smaller than a predetermined absolute value, is stored in the memory. According to the apparatus of the present invention, it is possible to reproduce a signal with satisfactory resolution and S/N ratio, even when the signal has a monotone decreasing signal waveform such as a case where the signal is related to the sound produced by a percussion instrument.

Other objects and further features of the present invention will be apparent from the following detailed description when read in conjunction with the accompanying drawings.

DETAILED DESCRIPTION

Figure 1A:
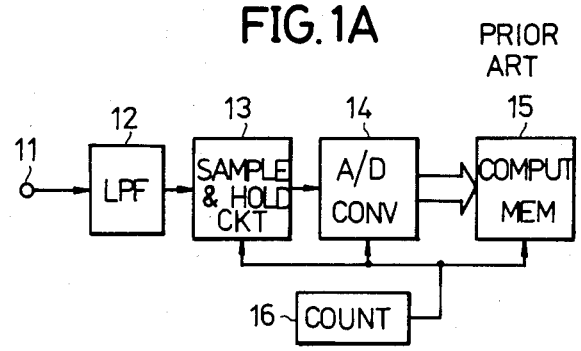
FIGS. 1A and 1B are systematic block diagrams respectively example of a conventional digital signal write-in apparatus and an example of a conventional reproducing apparatus.

In FIG. 1A, an audio signal corresponding to the sound of the actual instrument, is picked up and applied to an input terminal 11. The audio signal is filtered in a lowpass filter 12 so as to obtain a frequency component in a frequency band wherein recording and reproduction can be performed. An output signal of the lowpass filter 12 is supplied to a sample and hold circuit 13 wherein the signal is sampled at a predetermined interval responsive to sampling pulses from a counter 16. An output sampled signal of the sample and hold circuit 13 is supplied to an analog-to-digital (A/D) converter 14 wherein the signal is subjected to an analog-to-digital conversion and is converted into a digital signal having a quantization number of N bits, where N is a natural number. An output digital signal of the A/D converter 14 is written into a random access memory (RAM) 15 which is a built-in memory of a computer. The memory 15 will hereinafter be referred to as a computer memory. The sample and hold circuit 13, the A/D converter 14, and the computer memory 15 are operated in synchronism responsive to synchronizing pulses from the counter 16.

Figure 1B:
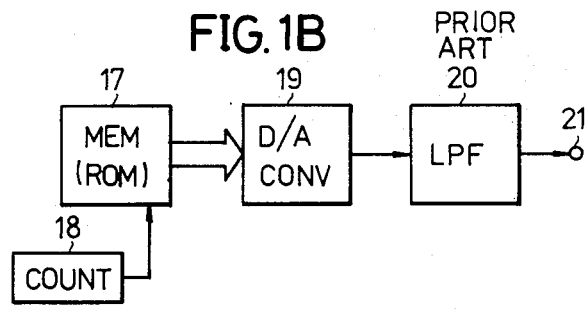

The stored digital signal in the computer memory 15 is duplicated in a plurality of read only memories (ROMs). The plurality of ROMs are built into each electronic organ. In FIG. 1B, one of the plurality of ROMs is shown as a memory 17. The stored digital signal is read out from the memory 17 from an address which is designated by an address signal or the like received from a counter 18. The digital signal read out from the memory 17, is subjected to a digital-to-analog conversion and is converted into an analog signal in a digital-to-analog (D/A) converter 19. The output analog signal of the D/A converter 19 is supplied to a lowpass filter 20 wherein an unwanted frequency component is eliminated, and an output analog signal of the lowpass filter 20 is produced through an output terminal 21.

Figure 2:
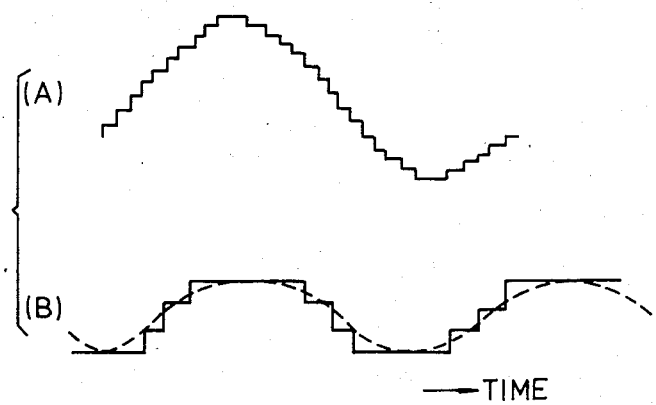
FIGS. 2(A) and 2(B) are graphs for explaining the resolution of a large level signal and the resolution of a small level signal.

According to the conventional apparatuses shown in FIGS. 1A and 1B, the resolution is equal to $2^N$ with respect to an input signal of a full scale shown in FIG. 2(A), when the quantization number of the digital signal is equal to N bits for one sampling point. On the other hand, the resolution is equal to $2^{(N-M)}$ with respect to an input signal having a level which is $\frac{1}{2}^M$ the full scale as shown in FIG. 2(B), where M is a natural number. Accordingly, the resolution is poor especially with respect to an input signal having a small level, and the waveform of the signal having the small level cannot be recorded with a satisfactory fidelity. Further, distortion and quantization noise are generated, and there is a problem in that the signal-to-noise (S/N) ratio is poor.

Figure 3A:
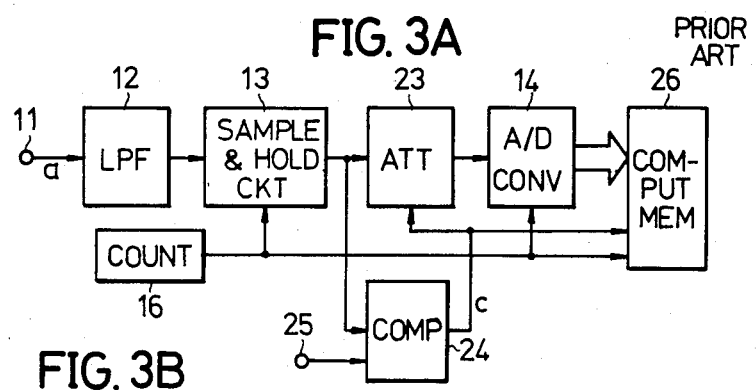
FIGS. 3A and 3B are systematic block diagrams respectively showing another example of a conventional digital signal write-in apparatus and another example of a conventional reproducing apparatus.
Figure 3B:
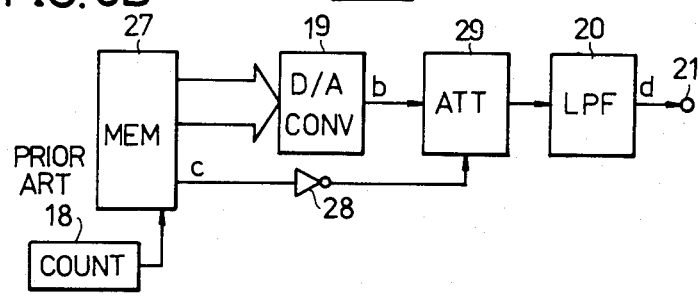
Figure 4:
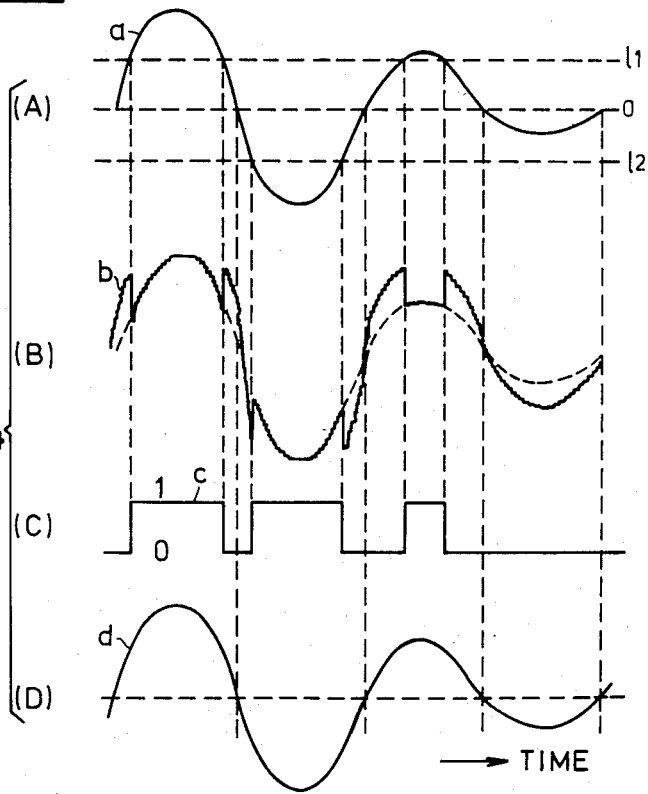
FIGS. 4(A) through 4(D) are graphs showing signal waveforms for operations of the block systems shown in FIGS. 3A and 3B.

Hence, apparatuses shown in FIGS. 3A and 3B have been proposed. In FIGS. 3A and 3B, those parts which are the same as those corresponding parts in FIGS. 1A and 1B are designated by the same reference numerals, and their description will be omitted. In FIG. 3A, the output signal of the sample and hold circuit 13 is supplied to an attenuator 23 and to a comparator 24. The comparator 24 compares the level of the output signal of the sample and hold circuit 13 with reference values $l_1$ and $l_2$ which are received through a terminal 25. An input signal a applied to the input terminal 11 has a signal waveform shown in FIG. 4(A). The comparator 24 produces a signal c having a signal waveform shown in FIG. 4(C). As shown in FIG. 4(C), the signal c assumes a low level when the level of the input signal a is within the reference values $l_1$ and $l_2$, and assumes a high level when the level of the input signal a exceeds the reference values $l_1$ and $l_2$. The output signal c of the comparator 24 is supplied to the attenuator 23. The output signal c of the comparator 24 is also supplied to and stored in a computer memory 26 as a 1-bit gain change discriminating signal.

Figure 5:
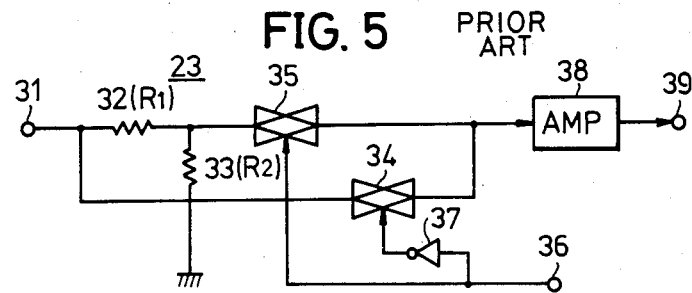
FIG. 5 is a circuit diagram showing an example of an attenuator in the block system shown in FIG. 3A.

The attenuator 23 has a construction shown in FIG. 5, for example. The output sampled signal of the sample and hold circuit 13 is supplied to a terminal 31. The sampled signal is supplied to a bilateral analog switch 34 and to a voltage divider comprising resistors 32 and 33 respectively having resistances $R_1$ and $R_2$. The voltage divider divides the sampled signal by $R_2/(R_1+R_2)$, and supplies the voltage divided signal to a bilateral analog switch 35. The bilateral analog switches 34 and 35 are respectively turned ON responsive to a high-level control signal and are respectively turned OFF responsive to a low-level control signal. The control signal for the bilateral analog switch 34 is the signal c received through an input terminal 36, and the control signal for the bilateral analog switch 35 is obtained from an inverter 37 which inverts the phase of the signal c. Accordingly, during the large level period of the input signal a in which the signal c assumes a high level, the bilateral switch 35 is turned ON, and the voltage divided sampled signal is supplied to an amplifier 38. The amplifier 38 multiplies the signal by $(R_1+R_2)/R_2$, and a signal in which the level is restored to the original level is obtained through an output terminal 39.

On the other hand, during the small level period of the input signal a in which the signal c assumes a low level, the bilateral analog switch 34 is turned ON, and the sampled signal is supplied to the amplifier 38. The amplifier 38 amplifies the signal by $(R_1+R_2)/R_2$, and the amplified signal is obtained through the output terminal 39. Hence, the attenuator 23 leaves the large level portion of the input signal a unchanged, and amplifies the small level portion of the input signal a. The output signal of the attenuator 23 is supplied to the A/D converter 14 wherein the signal is coverted into a level code (digital signal) indicative of the level information. An output digital signal of the A/D converter 14 is written into the computer memory 26.

Accordingly, among the N bits which can be transmitted, the signal c is stored in the computer memory 26 as the one bit indicating the existence of a gain change, and the remaining (N−1) bits are stored in the computer memory 26 as the level code.

In the reproducing apparatus shown in FIG. 3B, the digital signal which is stored in the computer memory 26 is duplicated and stored in a memory 27. Among the digital signal stored in the memory 27, the (N−1)-bit level code is read out from the memory 27 and is supplied to the D/A converter 19 wherein the level code is converted into an analog signal b indicated by a solid line in FIG. 4(B). The output analog signal b of the D/A converter 19 is supplied to an attenuator 29. On the other hand, the 1-bit gain bit (signal c) read out from the memory 27 is supplied to the attenuator 29 through an inverter 28.

As shown in FIG. 4(B), the output signal b of the D/A converter 19 is amplified with respect to the input signal a between the reference values $l_1$ and $l_2$, and remains unchanged with respect to the input signal a exceeding the reference values $l_1$ and $l_2$. In FIG. 4(B), a phantom line indicates the original signal waveform of the input signal a.

The attenuator 29 has a construction similar to the attenuator 23 shown in FIG. 5, except that the attenuator 29 does not have the amplifier 38. When the signal (reproduced signal) b having a period in which the level is amplified is supplied to the attenuator 29, the signal b is multiplied by $R_2(R_1+R_2)$ and the reproduced signal level is restored to the original signal level, since a high-level signal is supplied to the attenuator 29 from the inverter 28. On the other hand, when the signal b having no period in which the level is amplified is supplied to the attenuator 29, the signal b is obtained unchanged, since a low-level signal is supplied to the attenuator 29 from the inverter 28. The reproduced signal obtained from the attenuator 29 is supplied to the lowpass filter 20 wherein the unwanted frequency component is eliminated. The lowpass filter 20 produces a reproduced signal d shown in FIG. 4(D) which is obtained through the terminal 21.

According to the latter conventional apparatuses shown in FIGS. 3A and 3B, an input signal having a relatively small level is amplified, subjected to an analog-to-digital conversion, and written into the memory 27. Hence, compared to the conventional apparatuses shown in FIGS. 1A and 1B, the recording can be performed with a high resolution especially with respect to an input signal having a small level.

However, according to the latter conventional apparatuses shown in FIGS. 3A and 3B, at least one bit among the total data bits is constantly used as the gain bit, and the remaining bits are used for the level code. For this reason, when the level of the input signal a reaches the full scale, the resolution becomes poorer than the resolution obtainable in the conventional apparatuses shown in FIGS. 1A and 1B because of the reduced number of bits used for the level code, and there is a problem in that distortion and quantization noise are generated. Further, when several bits among the total data bits are used for the gain bit in the latter conventional apparatuses shown in FIGS. 3A and 3B, the resolution becomes even poorer.

In addition, the level of the input signal is assumed as being small in a vicinity of a zero level thereof, and the level of the input signal is amplified in the vicinity of the zero level, even when the level of the input signal is large. As a result, the gain is changed at various points in the signal waveform. Therefore, a crossover distortion occurs unless attenuators having accurate gains are used for the attenuators 23 and 29, and there is a problem in that the S/N ratio is deteriorated at various points in the signal waveform.

The present invention has eliminated the problems of the conventional apparatuses described heretofore, and description will hereinafter be given with respect to the embodiments of the invention.

Figure 6:
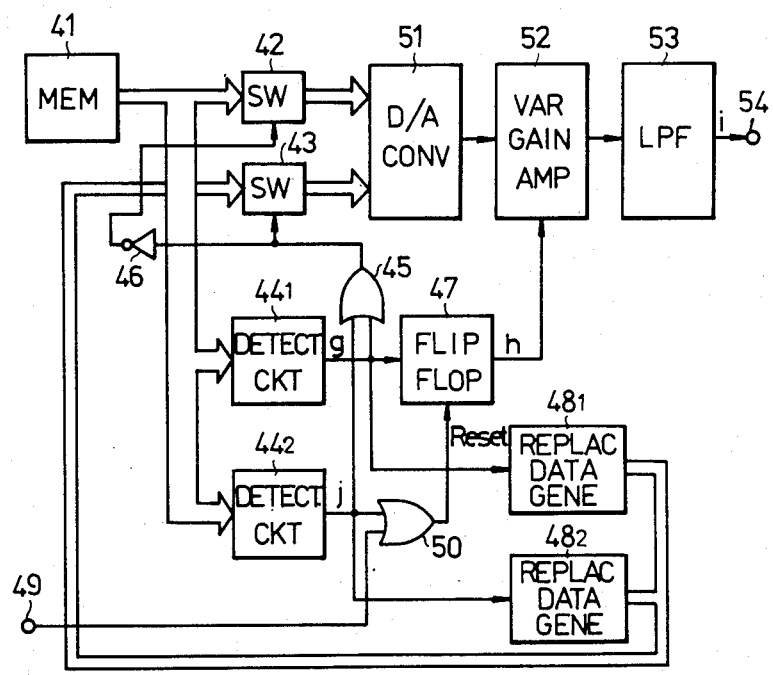
FIG. 6 is a systematic circuit diagram showing a first embodiment of an apparatus according to the present invention.
Figure 7:
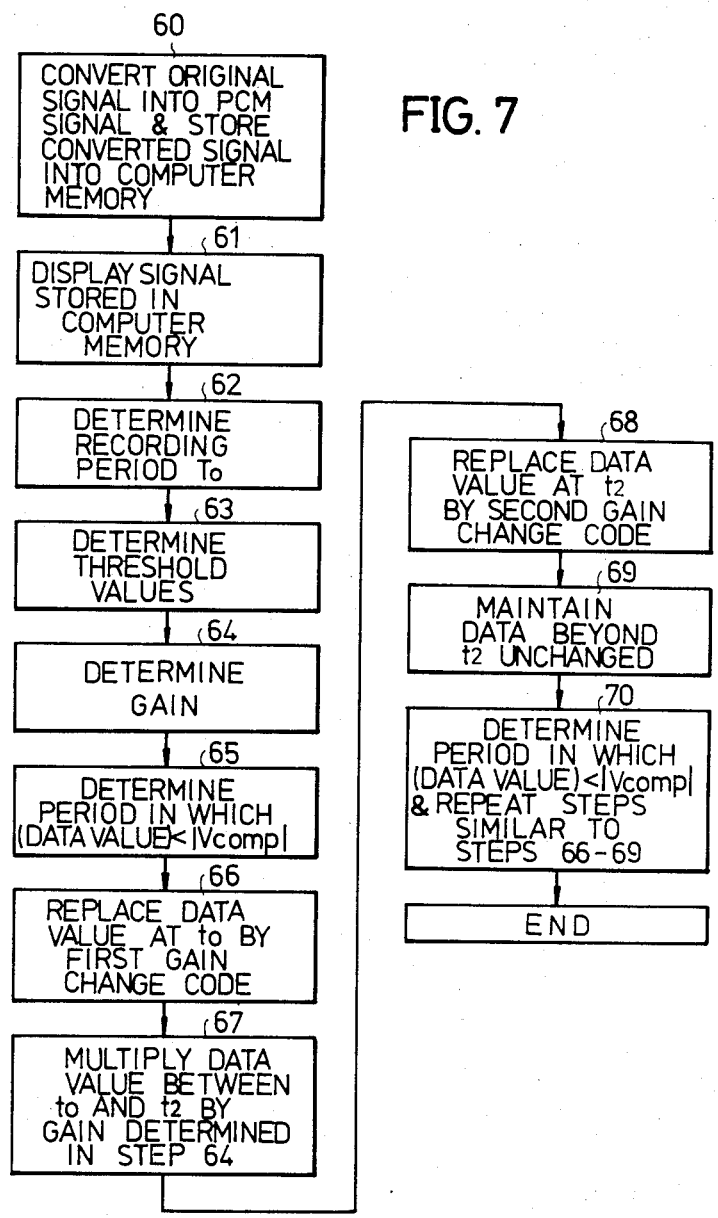
FIG. 7 is a flow chart for explaining the write-in operation with respect to a memory in the circuit system shown in FIG. 6.

In FIG. 6, a digital signal read out from a computer memory (not shown), is stored in a memory 41. The digital signal stored in the memory 41, is formed according to the operations shown in a flow chart of FIG. 7. In a step 60 shown in FIG. 7, the audio signal corresponding to the sound of the actual instrument is converted into the PCM signal (level code), and the PCM signal is written into the computer memory in a manner similar to the method described before in conjunction with FIG. 1A. The PCM signal is written into the computer memory so that the maximum value does not coincide with the gain change code which will be described hereinafter. Next, in a step 61, the PCM signal stored in the computer memory is read out and displayed on a display device such as a CRT so as to obtain a graphic display. A step 62 determines a recording period $T_o$ in which the PCM signal is to be recorded (stored) in the built-in memory (memory 41 shown in FIG. 6) of the electronic organ, from the signal waveform displayed on the display device. A step 63 determines positive and negative threshold values $+V_{comp}$ and $-V_{comp}$. Absolute values of the positive and negative threshold values $+V_{comp}$ and $-V_{comp}$ are the same.

Next, a step 64 determines a predetermined gain which is smaller than a ratio of a value which is indicated by the full scale (full scale value) and the threshold value $V_{comp}$, and a step 65 determines a predetermined period in which the level code (data value) becomes smaller than the absolute value $|V_{comp}|$ within the recording period $T_o$. When it is assumed that the original audio signal has a signal waveform shown in FIG. 8(A), the data value is smaller than the absolute value $|V_{comp}|$ within the predetermined period between times to and t2 shown in FIG. 8(A).

Figure 8:
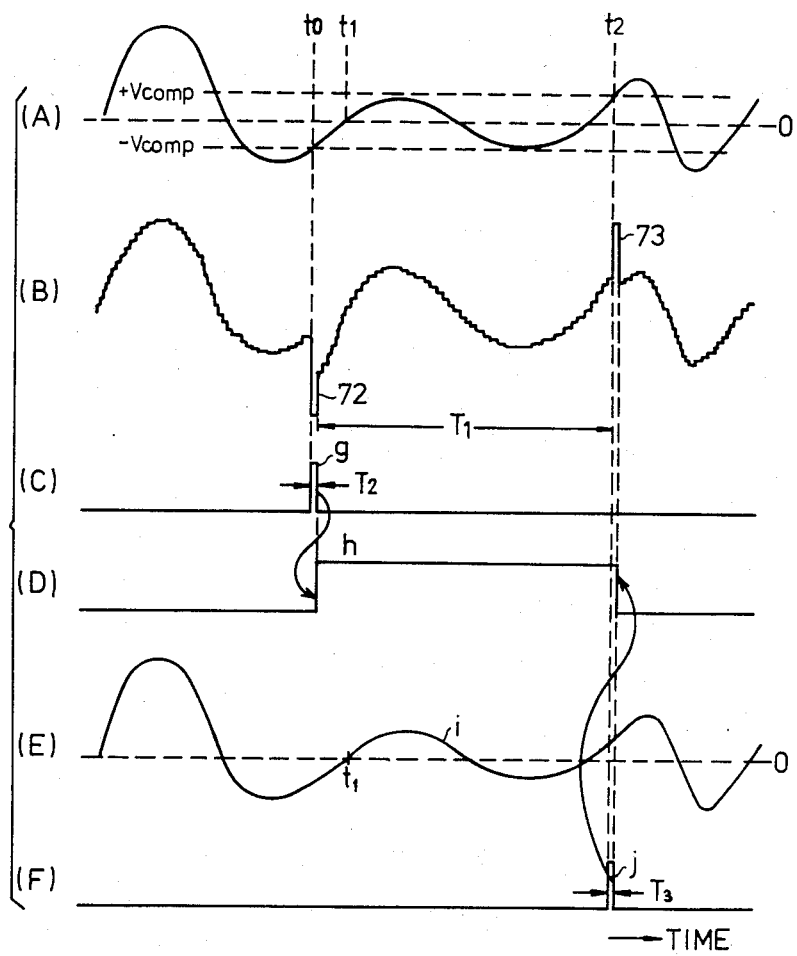
FIGS. 8(A) through 8(F) are graphs showing signal waveforms for explaining the operation of the circuit system shown in FIG. 6.

A step 66 replaces the data value at the first time $t_o$ of the predetermined period by a first gain change code. The data value in the predetermined section from the time $t_o$ to immediately before the time $t_2$, is multiplied by the predetermined gain which is determined in the step 64, and the amplified data value is again stored in the computer memory in a step 67. A step 68 replaces the data value at the time $t_2$ into a second gain change code. Thereafter, the data beyond the time $t_2$ is not subjected to the multiplication, and remain unchanged in a step 69. Thereafter, a period in which the data value is smaller than the absolute value $|V_{comp}|$ is determined in a step 70, and steps similar to the steps 66 through 69 are repeated. When the data value (level code) and the gain change codes which are finally stored again in the computer memory, are read out from the computer memory and are subjected to the digital-to-analog conversion, a signal having a signal waveform shown in FIG. 8(B) is obtained. In FIG. 8(B), a first gain change code 72 has a pulse width equal to one sampling period, and has a negative maximum value (for example, all eight bits are "0"). A second gain change code 73 has a pulse width equal to one sampling period, and has a positive maximum value (for example, all eight bits are "1"). The signal in a period $T_1$ between the first gain change code 72 and the second gain change code 73, is amplified by the predetermined gain which is determined in the step 64 compared to the signal in the period corresponding to the original audio signal waveform shown in FIG. 8(A). A digital signal which is obtained by subjecting the signal shown in FIG. 8(B) to a quantization, is read out from the computer memory and is stored into the memory 41 shown in FIG. 6.

When the player (operator) of the electronic organ plays a key, a digital signal (level code or gain change code) is read out from a predetermined address within the memory 41, which predetermined address corresponds to the played key. The digital signal read out from the memory 41, is supplied to a switching circuit 42, a first gain change code detecting circuit $44_1$, and a second gain change code detecting circuit $44_2$. During a period in which the first gain change code 72 is not detected in the first gain detecting circuit $44_1$, a high-level signal is supplied to the switching circuit 42 from an inverter 46 so as to turn ON the switching circuit 42. Thus, the digital signal read out from the memory 41 is passed through the switching circuit 42, and is supplied to a D/A converter 51 wherein the digital signal is converted into an analog signal.

On the other hand, when the first gain change code 72 is detected in the first detecting circuit $44_1$, the first detecting circuit $44_1$ produces a high-level detection signal g shown in FIG. 8(C). This detection signal g has a pulse width $T_2$ which is equal to one sampling period. The detection signal g is applied to a switching circuit 43 through an OR circuit 45. The detection signal g is also supplied to the switching circuit 44, through the OR circuit 45 and the inverter 46. Accordingly, during one sampling period $T_2$, the switching circuit 42 is turned OFF while the switching circuit 43 is turned ON. As a result, an output signal of a replacing data generating circuit $48_1$ is passed through the switching circuit 43 and is supplied to the D/A converter 51, and moreover, the supply of the first gain change code 72 to the D/A converter 51 is blocked by the switching circuit 42.

In addition, the detection signal g is applied to the replacing data generating circuit $48_1$. The replacing data generating circuit $48_1$ generates a replacing data containing a level information corresponding to the negative threshold value $-V_{comp}$, during the period of the pulse width of the detection signal g. Further, the detection signal g is supplied to a flip-flop 47 so as to set the flip-flop 47 responsive to a falling edge of the detection signal g. Thus, the flip-flop 47 produces a high-level signal h shown in FIG. 8(D) after the period $T_2$. The signal h is applied to a variable gain amplifier 52 so as to control the gain of the variable gain amplifier 52. The gain of the variable gain amplifier 52 is controlled to a first value which is a predetermined small value during a high-level period of the signal h, and is controlled to a second value which is larger than the first value during a low-level period of the signal h. Hence, the analog signal obtained from the D/A converter 51, is the analog signal which is obtained by subjecting the level code read out from the memory 41 to the digital-to-analog conversion during the period until the first gain change code 72 is detected, and is the signal having the negative threshold value $-V_{comp}$ which is obtained by subjecting the replacing data received from the replacing data generating circuit $48_1$ to the digital-to-analog conversion during the period (one sampling period $T_2$) in which the first gain change code 72 is detected. During the period until the first gain change code 72 is detected, and during the period in which the first gain change code 72 is detected, the analog signal obtained from the D/A converter 51 is supplied to the variable gain amplifier 52 which is controlled to have a gain equal to the second value.

During a period after the level of the detection signal g changes from a high level to a low level, the switching circuit 42 is turned ON while the switching circuit 43 is turned OFF. Thus, the analog signal which is obtained by subjecting the level code read out from the memory 41 to a digital-to-analog conversion, is supplied to the variable gain amplifier 52 which is controlled to have a gain equal to the first value. In this case, the level of the analog signal is attenuated to the original level, in the variable gain amplifier 52.

When the second gain change code 73 is read out from the memory 41, this second gain change code 73 is detected in the second detecting circuit $44_2$. The second detecting circuit $44_2$ produces a high-level detection signal j shown in FIG. 8(F) which has a pulse width $T_3$ equal to one sampling period. The detection signal j is passed through the OR circuit 45 and is applied to the switching circuit 43 so as to turn ON the switching circuit 43. On the other hand, the detection signal j is passed through the inverter 46 and is applied to the switching circuit 42 so as to turn OFF the switching circuit 42. At the same time, the detection signal j is supplied to a replacing data generating circuit $48_2$. The detection signal j is also passed through an OR circuit 50 and is applied to a reset terminal of the flip-flop 47, so as to reset the flip-flop 47 responsive to a falling edge of an output signal of the OR circuit 50. Responsive to the detection signal j, the replacing data generating circuit $48_2$ generates a replacing data, and supplies the replacing data to the D/A converter 51 through the switching circuit 43. The replacing data generated by the replacing data generating circuit $48_2$ has a value, such that the variable gain amplifier 52 produces an analog signal having a level corresponding to the positive threshold value $+V_{comp}$. As the level code subsequent to the second gain change code 73 begins to be read out from the memory 41, the first and second detecting circuits $44_1$ and $44_2$ each produce a low-level signal, and the switching circuit 42 is turned ON while the switching circuit 43 is turned OFF. Further, the replacing data are no longer produced from the replacing data generating circuits $48_1$ and $48_2$. In addition, since the output signal h of the flip-flop 47 assumes a low level, the gain of the variable gain amplifier 52 again assumes the second value.

Therefore, the signal which is obtained from the variable gain amplifier 52 and is eliminated of the unwanted frequency component in a lowpass filter 53, is a reproduced signal which corresponds to the original audio signal (shown in FIG. 8(A)) before storage into the computer memory described before. An output reproduced signal i of the lowpass filter 52 having a signal waveform shown in FIG. 8(E), is produced through an output terminal 54.

A reset signal which is obtained from a terminal 49 and is supplied to the flip-flop 47 through the OR circuit 50, resets the flip-flop 47 to the initial state when starting the operation of the circuit.

Figure 9:
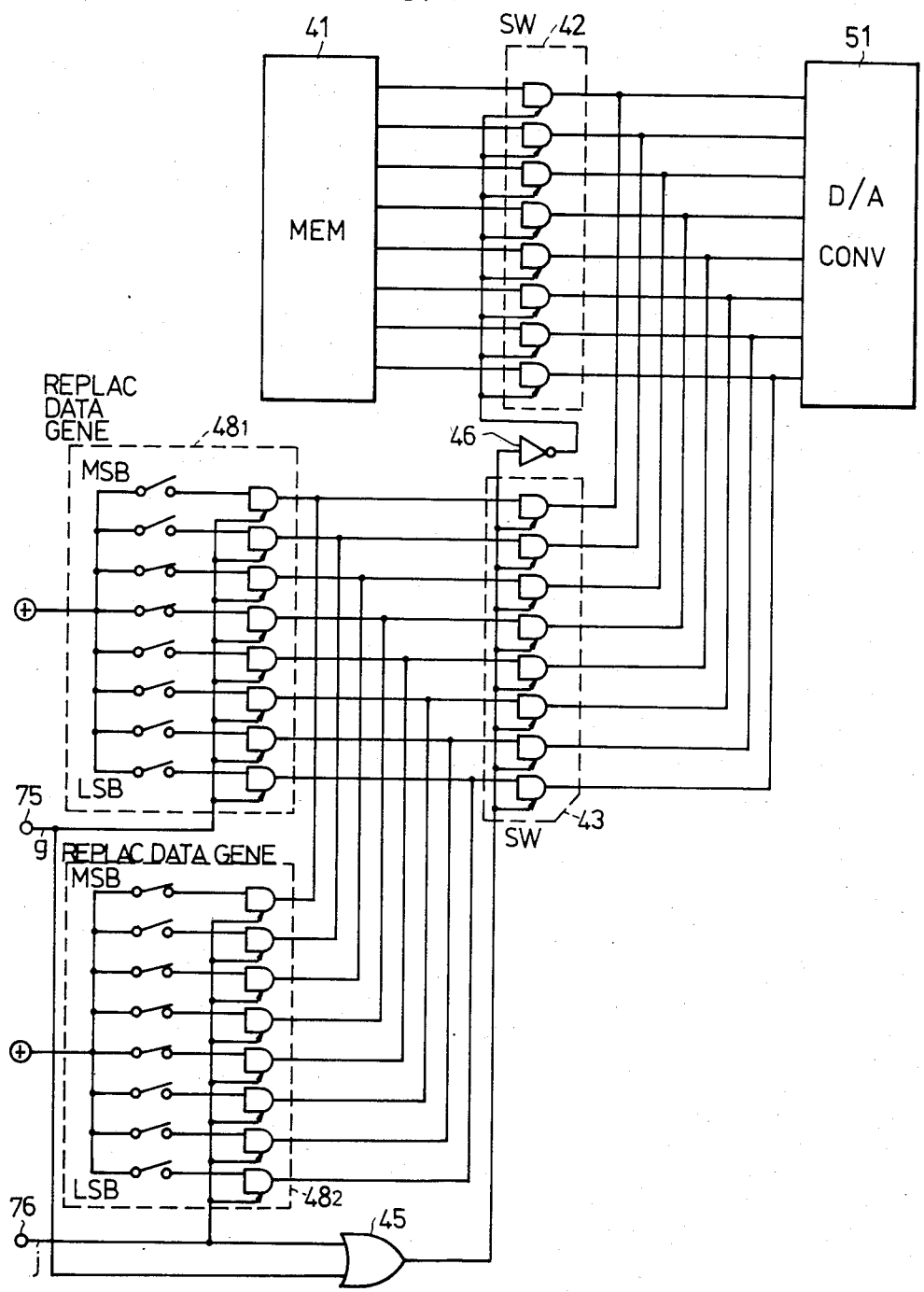
FIG. 9 is a circuit diagram showing an embodiment of an essential part of the circuit system shown in FIG. 6.

As shown in FIG. 9, the replacing data generating circuits $48_1$ and $48_2$ are each made up of eight switches and eight tri-state gates. The eight tri-state gates of the replacing data generating circuit $48_1$ produce signals having the same logic values as input signals thereto from the eight respective switches, only during the period $T_2$ when the detection signal g is applied to a terminal 75, and the eight tri-state gates each assume a high impedance state when the detection signal g is not applied to the terminal 75. On the other hand, the eight tri-state gates of the replacing data generating circuit $48_2$ produce signals having the same logic values as input signals thereto from the eight respective switches, only during the period $T_3$ when the detection signal j is applied to a terminal 76, and the eight tri-state gates each assume a high impedance state when the detection signal j is not applied to the terminal 76. In addition, the switching circuits 42 and 43 are each made up of eight tri-state gates, as shown in FIG. 9. The switching circuit 42 receives a control signal from the inverter 46, and the switching circuit 43 receives a control signal from the OR circuit 45. The tri-state gates of the switching circuits 42 and 43 produce signals having the same logic values as input signals thereto when the respective control signals assume a high level, and the tri-state gates assume a high impedance state when the respective control signals assume a low level. In FIGS. 8(A) and 8(E), the time $t_1$ indicates the time when the signal assumes a zero level. Further, in FIGS. 6, 10, and 14, the illustration of an address counter is omitted.

The reproducing apparatus shown in FIG. 6 can also reproduce with a satisfactory resolution a signal shown in FIG. 8(A) wherein the level alternately becomes large and small. The hand clapping sounds of a plurality of players, which are used in light music or the like, have a signal waveform shown in FIG. 8(A), since there will be a time difference among the hand claps even when the players clap their hands simultaneously. According to the present embodiment, it is possible to independently reproduce such hand clapping sounds with a satisfactory resolution.

In a case where the center level of the signal shown in FIG. 8(A) is replaced by a single gain change code, it is only necessary to provide a single replacing data generating circuit.

Figure 10:
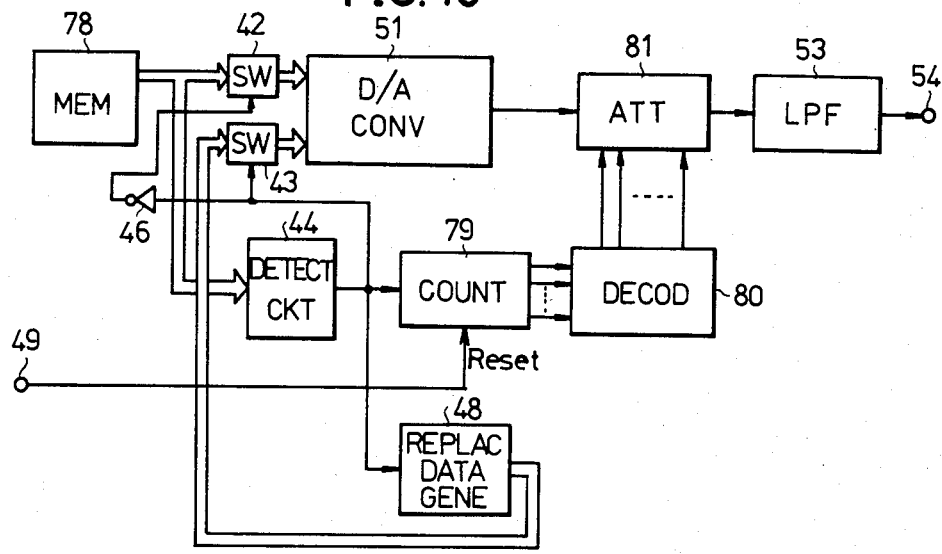
FIG. 10 is a systematic block diagram showing a second embodiment of the apparatus according to the present invention.
Figure 12:
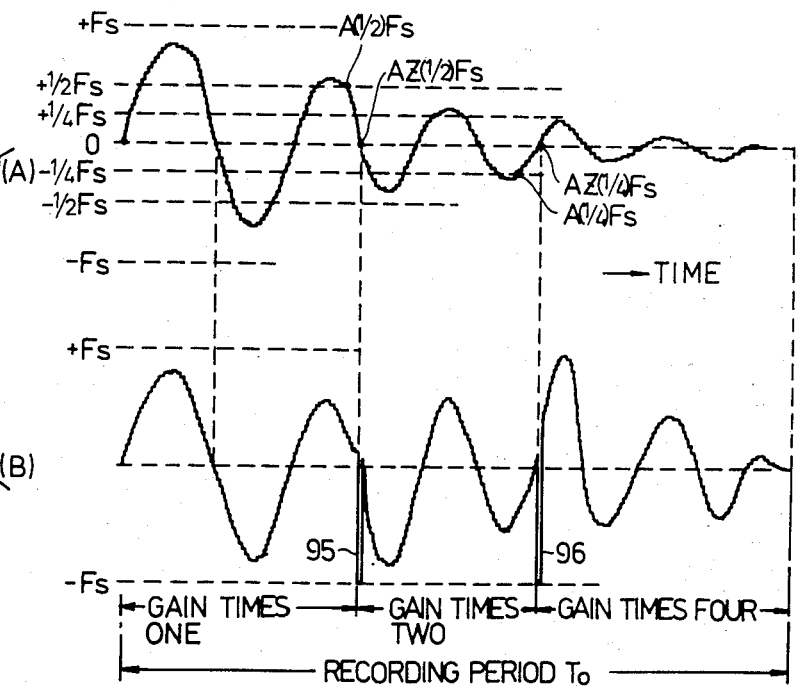
FIGS. 12(A) and 12(B) are graphs showing signal waveforms for explaining the operation of the block system shown in FIG. 10.
Figure 11:
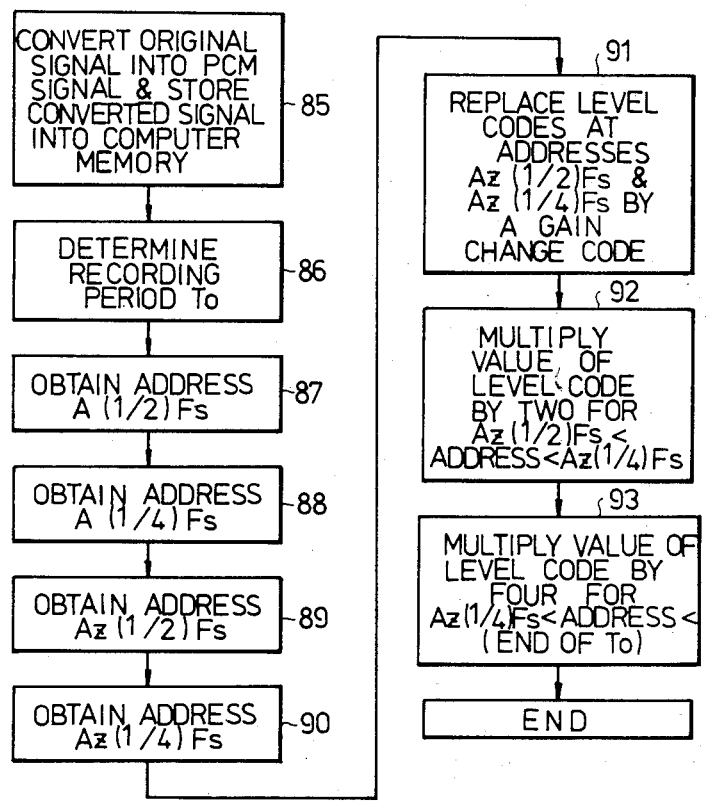
FIG. 11 is a flow chart for explaining the write-in operation with respect to a memory in the block system shown in FIG. 10.

Next, description will be given with respect to a second embodiment of the apparatus according to the present invention, by referring to FIGS. 10 through 13. In FIG. 10, those parts which are the same as those corresponding parts in FIG. 6 are designated by the same reference numerals, and their description will be omitted. In FIG. 10, a memory 78 stores the digital signal read out from the computer memory (not shown). The digital signal stored in the memory 78, is a PCM signal which is related to the sound of a percussion instrument or the like and has an attenuating signal waveform. The PCM signal is formed according to the flow chart shown in FIG. 11. First, in a step 85, the audio signal which is related to the sound of the actual instrument and has the attenuating signal waveform, is converted into the PCM signal (level code) and is written into the computer memory, similarly as in the case described before in conjunction with FIG. 1A. In this case, the maximum value (absolute value) of the signal is set to a value greater than $|(\frac{1}{2})(+F_s)|$, where $F_s$ indicates the level of the signal to the full scale. Next, a step 86 determines the period $T_o$ in which the recording is to be finally performed. In a step 87, the data value is examined from the terminal end to the starting end of the period $T_o$, so as to obtain an address $A(\frac{1}{2})F_s$ where the absolute value of the signal exceeds $|\pm(\frac{1}{2})F_s|$ for the first time. In a case where the signal obtained by subjecting the above PCM signal to the digital-to-analog conversion has the signal waveform shown in FIG. 12(A), the address $A(\frac{1}{2})F_s$ becomes the last intersection between the signal waveform and the value $+(\frac{1}{2})F_s$ within the period $T_o$.

Next, in a step 88, the data value is examined from the terminal end to the starting end of the period $T_o$, so as to obtain an address $A(\frac{1}{4})F_s$ where the absolute value of the signal exceeds $|\pm(\frac{1}{4})F_s|$ for the first time. Then, in a step 89, the the data value is examined from the address $A(\frac{1}{2})F_s$ towards the terminal end of the period $T_o$, so as to obtain an address $Az(\frac{1}{2})F_s$ shown in FIG. 12(A) where the signal crosses the zero level or assumes a value approximately equal to the zero level for the first time. Thereafter, in a step 90, the data value is examined from the address $A(\frac{1}{4})F_s$ towards the terminal end of the period $T_o$, so as to obtain an address $Az(\frac{1}{4})F_s$ shown in FIG. 12(A) where the signal assumes a value approximately equal to the zero level for the first time, by a method similar to the method employed in the step 89.

In a subsequent step 91, the level codes at the addresses $Az(\frac{1}{2})F_s$ and $Az(\frac{1}{4})F_s$ are respectively replaced by a gain change code (for example, $-F_s$). In a step 92, the value of the level code within a period in which the address is greater than $Az(\frac{1}{2})F_s$ and is less than $Az(\frac{1}{4})F_s$, is multiplied by two. In a step 93, the value of the level code within a period up to the terminal end of the period $T_o$ in which the address is greater than $Az(\frac{1}{4})F_s$, is multiplied by four. When the data value (level code) and the gain change code which are finally stored in the computer memory, are reproduced and are subjected to the digital-to-analog conversion, a signal shown in FIG. 12(B) is obtained. In FIG. 12(B), gain change codes 95 and 96 respectively have a pulse width of one sampling period, and for example, the value of the gain change codes 95 and 96 are respectively selected to a negative maximum value (for example, all the eight bits are "0"). In a period which starts immediately after the gain change code 95 and terminates immediately before the gain change code 96, the level of the signal is amplified to twice the level of the original signal. Further, in a period which starts immediately after the gain change code 96 and terminates at the terminal end of the period $T_o$, the level of the signal is amplified to four times the level of the original signal. The signal shown in FIG. 12(B) is quantized and then stored in the computer memory. The digital signal read out from the computer memory, is duplicated in a plurality of ROMs.

The memory 78 shown in FIG. 10, is one of such plurality of ROMs, and the memory 78 is built into one electronic organ. When the player plays a predetermined key, the stored digital signal in the memory 78 is read out from the memory 78, and is supplied to the switching circuit 42 and to a gain change code detecting circuit 44. The gain change code detecting circuit 44 is designed to detect the gain change codes 95 and 96 described before, and has a construction similar to the construction of the gain change code detecting circuits $44_1$ and $44_2$. The gain change code detecting circuit 44 is designed to compare the negative full scale value $-F_s$ and the value of the input digital signal, and to produce a detection signal when the two values coincide. The negative full scale value $-F_s$ is equal to the values of the gain change codes 95 and 96, and the level code is set so as not to assume the negative full scale value $-F_s$. For this reason, it is possible to positively detect the gain change codes 95 and 96 in the gain change code detecting circuit 44.

An output signal of the gain change code detecting circuit 44 is supplied to the switching circuit 43 as a switching signal. The output signal of the gain change code detecting circuit 44 is also supplied to the switching circuit 42 as a switching signal, through the inverter 46. Further, the output signal of the gain change code detecting circuit 44 is supplied to a replacing data generating circuit 48, and to a counter 79. The replacing data generating circuit 48 generates a replacing data of zero level, responsive to the output signal of the gain change code detecting circuit 44. The counter 79 counts the output signal of the gain change code detecting circuit 44. Accordingly, a counted value in the counter 79 indicates the number of times the gain change codes 95 and 96 are detected, and an output signal of the counter 79 indicative of the counted value is supplied to a decoder 80. The decoder 80 supplies to an attenuator 81 a plurality of bits signals in parallel, responsive to the output signal of the counter 79.

Figure 13:
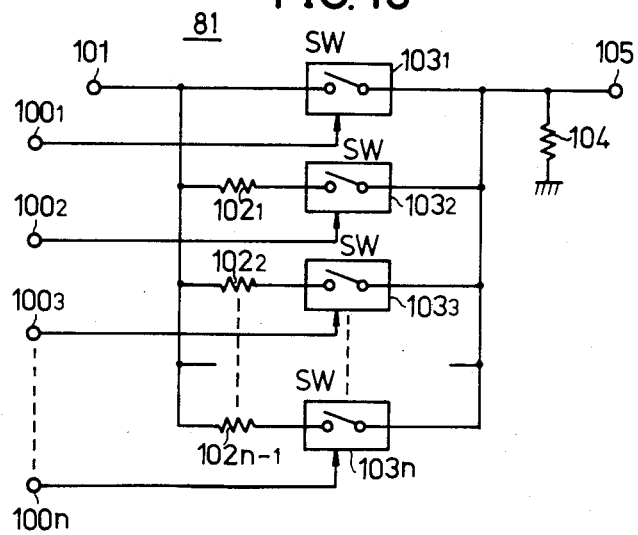
FIG. 13 is a circuit diagram showing an embodiment of an essential part of the block system shown in FIG. 10.

For example, the attenuator 81 is made up of $n-1$ resistors $102_1$ through $102_{n-1}$, and n switching circuits $103_1$ through $103_n$, as shown in FIG. 13, where n is an integer. The n-bit output signal of the decoder 80 is supplied to the switching circuits $103_1$ through $103_n$ through respective terminals $100_1$ through $100_n$, and one of the switching circuits $103_1$ through $103_n$ is turned ON. The output analog signal of the D/A converter 51 is obtained through a terminal 101, and is supplied directly to the switching circuit $103_1$, and is supplied to the switching circuits $103_2$ through $103_n$ through the respective resistors $102_1$ through $102_{n-1}$. Thus, the output analog signal of the D/A converter 51 is passed through one of the switching circuits $103_1$ through $103_n$ and is produced through an output terminal 105. The resistors $102_1$ through $102_{n-1}$ have mutually different resistances, and constitute a voltage divider together with a resistor 104. Hence, in a case where the resistors 104 and $102_1$ each have a resistance of R and the resistor $102_2$ has a resistance of 3R, the switching circuit $103_2$ is turned ON when the counted value in the counter 79 becomes equal to "1" responsive to the first detection of the gain change code 95, and the signal in the period in which the gain is two times is attenuated by $\frac{1}{2}$ and the signal level is returned to the original level. The signal having the original signal level is produced through the output terminal 105. In a case where only the switching circuit $103_3$ is turned ON responsive to the detection of the second gain change code 96, the signal in the period in which the gain is four times is attenuated by $\frac{1}{4}$ and the signal level is returned to the original signal level, and the signal having the original signal level is produced through the output terminal 105. Before the gain change code 95 is detected, the counted value in the counter 79 is equal to "0", and only the switching circuit $103_1$ is turned ON. Hence, in this case, the analog signal in the period in which the gain is one times (unchanged), is not attenuated, and the signal is produced through the output terminal 105 unchanged.

The analog signal obtained through the output terminal 105, is passed through the lowpass filter 53 shown in FIG. 10, and is produced through the output terminal 54.

In the reproducing apparatus shown in FIG. 10, the signal having the relatively small level is amplified by varying the gain in two stages. However, the present invention is not limited to this embodiment, and the gain may be varied in three or more stages depending on the resolution.

According to the apparatus of the present invention, only the full scale value $F_s$ is used for the gain change code. For this reason, when it is assumed that the input signal has a quantization number of N bits, the level of the input signal can be described by $2^N-1$ quantization steps (in the case of FIG. 10) or $2^N-2$ quantization steps (in the case of FIG. 6). On the other hand, in the conventional apparatus shown in FIG. 3B, the level code has $N-1$ bits and the gain bit has one bit, for example, and the level of the input signal can only be described by $2^{N-1}$ quantization steps. Therefore, according to the apparatus of the present invention, it is possible to greatly improve the resolution of the large level input signal compared to the conventional apparatus shown in FIG. 3B.

Figure 14:
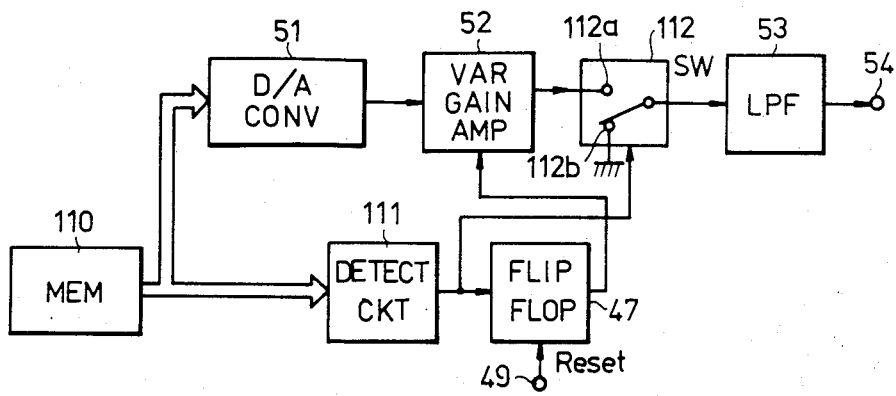
FIG. 14 is a systematic block diagram showing a third embodiment of the apparatus according to the present invention.

Next, description will be given with respect to a third embodiment of the apparatus according to the present invention, by referring to FIG. 14. In FIG. 14, those parts which are the same as those corresponding parts in FIG. 6 are designated by the same reference numerals, and their description will be omitted. In FIG. 14, a level code (PCM signal) is stored in a memory 110. The level code is obtained by subjecting an original analog signal having a monotone decreasing signal waveform, for example, to a pulse code modulation. A gain change code is stored in the memory 110 instead of the level code, only when the original analog signal first assumes an intermediate level (center level) between the positive and negative peak levels of the original analog signal within a region in which the level of the original analog signal is lower than a predetermined reference level. In a case where the quantization number is eight bits, the gain change code is set to an intermediate value ("80" in hexadecimal). The write-in of the gain change code and the level code into the memory 110, can be performed by a method similar to the method described before in conjunction with the flow chart of FIG. 11. Accordingly, since the write-in of the gain change code and the level code into the memory 110 can readily be understood by those skilled in the art, description thereof will be omitted.

The code which is read out from the memory 110, is supplied directly to the D/A converter 51 wherein the code is converted into an analog signal. An output analog signal of the D/A converter 51 is supplied to the variable gain amplifier 52. On the other hand, the code read out from the memory 110 is also supplied to a gain change code detecting circuit 111 wherein the gain change code having the intermediate value "80" in hexadecimal is detected. When the gain change code is detected, a detection signal is produced from the gain change code detecting circuit 111. The output detection signal of the gain change code detecting circuit 111 reverses the output signal level of the flip-flop 47 to a high level. At the same time, the output detection signal of the gain change code detecting circuit 111 controls the switching of a switching circuit 112, so that the switching circuit 112 selectively produces a signal applied to a terminal 112b thereof. The switching circuit 112 is controlled to selectively produce a signal applied to a terminal 112a thereof, during a period in which no detection signal is supplied to the switching circuit 112.

Accordingly, during a period before the gain change code is detected, the switching circuit 112 selectively produces the output analog signal of the variable gain amplifier 52 which is set to the small gain. During one sampling period in which the gain change code is detected, the switching circuit 112 selectively produces the center level signal applied to the terminal 112b. After this one sampling period, the switching circuit 112 selectively produces the output analog signal of the variable gain amplifier 52 which is set to the large gain.

Figure 15:
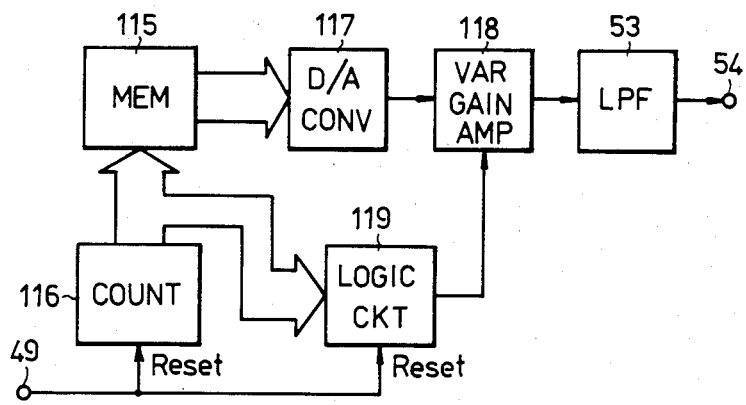
FIG. 15 is a systematic block diagram showing another embodiment of the apparatus according to the present invention.
Figure 16:
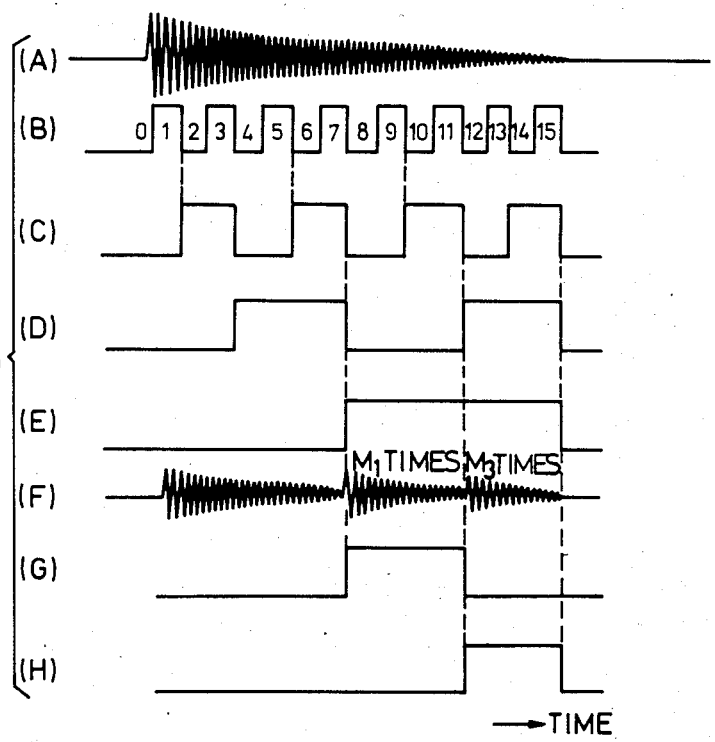
FIGS. 16(A) through 16(H) are graphs showing signal waveforms for explaining the operation of the block system shown in FIG. 15.

Next, description will be given with respect to another embodiment of the apparatus according to the present invention by referring to FIGS. 15 and 16. An audio signal shown in FIG. 16(A) which is related to the sound of the actual instrument and has a monotone decreasing signal waveform, is subjected to a wave shaping and is shaped into a signal shown in FIG. 16(F). The signal shown in FIG. 16(F) is subjected to a pulse code modulation so as to obtain the level code, and this level code is stored in a memory 115 shown in FIG. 15. When the player plays a key of the electronic organ, a signal corresponding to the played key is read out from the memory 115 responsive to the output digital signal of a counter 116. The signal read out from the memory 115 is subjected to a digital-to-analog conversion in a D/A converter 117, and an output analog signal of the D/A converter 117 having the signal waveform shown in FIG. 16(F) is supplied to a variable gain amplifier 118.

On the other hand, upper four bits of the output digital signal of the counter 116 are supplied to a logic circuit 119. Among the upper four bits of the output digital signal of the counter 116, the least significant bit (LSB) has the signal waveform shown in FIG. 16(B). Further, the third significant bit, the second significant bit, and the most significant bit (MSB) respectively have the signal waveforms shown in FIGS. 16(C), 16(D), and 16(E).

The logic circuit 119 produces a first signal shown in FIG. 16(G) and second signal shown in FIG. 16(H). The first signal is obtained by taking the logical product of the MSB and a signal which is obtained by inverting the phase of the second significant bit. The second is obtained by taking a logical product of the second significant bit and the MSB. The gain of the variable gain amplifier 118 is multiplied by $1/M_2$ during a period in which the first signal is supplied to the variable gain amplifier 118. On the other hand, the gain of the variable gain amplifier 118 is multiplied by $1/M_3$ during a period in which the second signal is supplied to the variable gain amplifier 118. Further, during a period in which neither the first nor the second signal is supplied to the variable gain amplifier 118, the gain of the variable gain amplifier 118 is multiplied by one (that is, unchanged).

The output signal of the D/A converter 117 having the signal waveform shown in FIG. 16(F), is passed through the variable gain amplifier 118 and is returned to the original analog signal having the signal waveform shown in FIG. 16(A). The output signal of the variable gain amplifier 118 is passed through the lowpass filter 53, and is obtained through the output terminal 54.

The present invention is not limited to the embodiments described heretofore, and for example, the variable gain amplifiers 52 and 118 may be attenuators, and the attenuator 81 may be a variable gain amplifier. In addition, instead of employing the variable gain amplifier and the attenuator, a data bit shifting circuit (shift register) may be provided at the input stage of the D/A converter. In this case, the level of the digital signal may be increased or decreased by ½ by shifting the bits of the digital signal. Moreover, in a case where a multiplying type D/A converter in which the output signal level may be varied responsive to a control voltage (current), is used for the D/A converters 51 and 117, it is unnecessary to provide the variable gain amplifiers 52 and 118. Further, it is possible to use a dividing circuit instead of the variable gain amplifier and the attenuator.

In the embodiment shown in FIG. 10, description is given for a case where the signal has the monotone decreasing signal waveform. However, when an up-down counter is used for the counter 79, it is possible to apply the apparatus for a case where the signal has the signal waveform shown in FIG. 8(A).

Further, the present invention is not limited to these embodiments, but various variations and modifications may be made without departing from the scope of the present invention.

What is claimed is:

1. An apparatus for reproducing signals which are pre-stored in a memory, said apparatus comprising:
   a memory pre-stored with signals made up of a level code and a gain change code, said level code being an original analog signal which is amplified, sampled, and digitally coded, said original analog signal being amplified to an extent such that a maximum value of the original analog signal is smaller than a full scale value in a small level region within a predetermined period, said original analog signal having a level smaller than threshold values in said small level region, said gain change code having predetermined values and replacing said level code at least for a certain period from a predetermined time in said small level region;
   a detecting circuit for detecting said gain change code from a signal which is read out from said memory, and for producing an output detection signal when said gain change code is detected; and
   variable gain and digital-to-analog converting means supplied with the signal read out from said memory, for producing a reproduced signal having a signal waveform which is essentially the same as the signal waveform of said original analog signal, said variable gain and digital-to-analog converting means being variably controlled of a gain thereof after receiving the output detection signal of said detecting circuit so as to attenuate the level of the signal read out from said memory to an extent complementary to the amplification performed at the time when the signal is pre-stored in said memory, and subjecting the signal read out from said memory to a digital-to-analog conversion regardless of whether the output detection signal of said detecting circuit is received.

2. An apparatus for reproducing signals which are pre-stored in a memory, said apparatus comprising:
   a memory pre-stored with signal made up of a level code and a gain change code, said level code being an original analog signal which is amplified, sampled, and digitally coded, said original analog signal being amplified to an extent such that a maximum value of the original analog signal is smaller than a full scale value in a small level region within a predetermined period, said original analog signal having a level smaller than threshold values in said small level region, said gain change code having predetermined values and replacing said level code at least for a certain period from a predetermined time in said small level region;
   a detecting circuit for detecting said gain change code from a signal which is read out from said memory, and for producing an output detection signal when said gain change code is detected; and
   variable gain and digital-to-analog converting means supplied with the signal read out from said memory, for producing a reproduced signal having a signal waveform which is essentially the same as the signal waveform of said original analog signal, said variable gain and digital-to-analog converting means being variably controlled of a gain thereof after receiving the output detection signal of said detecting circuit so as to attenuate the level of the signal read out from said memory to an extent complementary to the amplification performed at the time when the signal is pre-stored in said memory, said variable gain and digital-to-analog converting means comprising a replacing data generating circuit for generating a replacing data responsive to the output detection signal of said detecting circuit, switching circuit means for selectively producing said replacing data during a period in which the output detection signal of said detecting circuit is received, and for selectively producing said level code read out from said memory during a period in which the output detection signal of said detecting circuit is not received, and signal converting means for converting an output signal of said switching circuit means into an analog signal, and for producing the reproduced signal in which the level is returned to the level of said original analog signal by being essentially varied of the gain to a predetermined value after receipt of the output detection signal of said detecting circuit.

3. An apparatus as claimed in claim 2 in which said replacing data generating circuit generates a replacing data having a value corresponding to a center level of said original analog signal.

4. An apparatus as claimed in claim 2 in which said memory pre-stores a first gain change code and a second gain change code together with said level code, said first gain change code replaces said level code during a predetermined period from a time when the level of said original analog signal first reaches one of said threshold values in said small level region, said second gain change code replaces said level code during a predetermined period from a time when the level of said original analog signal last reaches one of said threshold values in said small level region, said first gain change code and/or said second gain change code assumes a first value when said level code is to be replaced during said predetermined period from the time when the level of said original analog signal reaches a positive threshold value and assumes a second value when said level code is to be replaced during said predetermined period from the time when the level of said original analog signal reaches negative threshold value, said detecting circuit comprises a first detecting circuit for detecting the gain change code which assumes said first value and a second detecting circuit for detecting the gain change code which assumes said second value, said replacing data generating circuit comprising a first replacing data generating means for generating a first replacing data during a period in which a first detection signal is produced from said first detecting circuit and a second replacing data generating means for generating a second replacing data during a period in which a second detection signal is produced from said second detecting circuit, said switching circuit means selectively producing said first or second replacing data during a period in which said first or second detection signal is produced, and for selectively producing said level code read out from said memory during a period in which neither said first nor second detection signal is produced, and said signal converting means being variably controlled to have a small gain during a period from a time when said first or second detection signal is first produced until a time when said first or second detection signal is produced for the second time compared to other periods, and subjecting the signal read out from said memory to a digital-to-analog conversion.

5. An apparatus as claimed in claim 4 in which said first and second gain change codes are digital signal having a maximum or minimum full scale value corresponding to said positive or negative threshold value, said level code assumes a value other than said maximum or minimum full scale value, said first replacing data generating means generating the first replacing data having a level such that said signal converting means produces a signal having said positive threshold value in said small level region when said first replacing data is passed through said signal converting means, and said second replacing data generating means generating the second replacing data having a level such that said signal converting means produces a signal having said negative threshold value in said small level region when said second replacing data is passed through said signal converting means.

6. An apparatus as claimed in claim 2 in which said memory pre-stores a gain change code which has a constant value and replaces said level code for a certain period in said small level region every time said original analog signal corresponds to a center level immediately after reaching one of a plurality of threshold values having mutually different values, and said level code which is an analog signal which is sampled and digitally coded, said analog signal being said original analog signal which is changed of the level so that a signal level of said analog signal gradually increases or decreases in a period from a time when one gain change code is read out until a different gain change code is read out depending on a number of times said gain change code is read out, and said variable gain and digital-to-analog converting means comprises a counter for counting the output detection signal of said detecting circuit, said replacing data generating circuit generating a replacing data during a period in which said detecting circuit produces the detection signal, said signal converting means being supplied with an output signal of said switching circuit means and with an output signal of said counter as a gain control signal, for producing a reproduced signal having a signal waveform which is essentially the same as the signal waveform of said original analog signal by subjecting the output signal of said switching circuit means to a digital-to-analog conversion, and said signal converting means being varied of a gain thereof so that the gain gradually decreases or increases as a counted value in said counter increases.

7. An apparatus as claimed in claim 6 in which said signal converting means comprises a digital-to-analog converter for subjecting the output signal of said switching circuit means to a digital-to-analog conversion, a first switching circuit directly supplied with an output signal of said digital-to-analog converter, a second switching circuit supplied with the output signal of said digital-to-analog converter through first resistors having mutually different resistances, a second resistor commonly coupled to outputs of said first and second switching circuits, said second resistor constituting a voltage divider together with said first resistors, and a decoder for producing a signal responsive to the counted value in said counter so as to turn ON only one of said first and second switching circuits.

8. An apparatus as claimed in claim in which said memory pre-stores said gain change code which replaces said level code for a certain period in said small level region from a time when said original analog signal first reaches a center level, and said variable gain and digital-to-analog converting means comprises signal converting means for subjecting the signal read out from said memory to a digital-to-analog conversion so as to obtain an analog signal and variable gain means supplied with the output detection signal of said detecting circuit as a gain control signal, said variable gain means being varied of a gain thereof so as to attenuate the level of the analog signal from said signal converting means to an extent complementary to the amplification performed at the time when the signal is pre-stored in said memory after receipt of said detection signal compared to a time before said detection signal is received, and a switching circuit supplied with the output detection signal of said detecting circuit as a switching signal, for selectively producing a signal having a level corresponding to said center level during a period in which said detecting circuit produces said detection signal, and for selectively producing an output analog signal of said variable gain means during a period in which said detecting circuit does not produce said detection signal, as the reproduced signal.

9. An apparatus as claimed in claim 1 in which said original analog signal is an audio signal related to a sound which is picked up from an actual instrument.

* * * * *